United States Patent
Finke et al.

(10) Patent No.: US 10,914,162 B2
(45) Date of Patent: Feb. 9, 2021

(54) PROTECTIVE HOUSING FOR ELECTRONICS IN DOWNHOLE TOOLS

(71) Applicant: HALLIBURTON ENERGY SERVICES, INC., Houston, TX (US)

(72) Inventors: Michael Dewayne Finke, Cypress, TX (US); Mine Kazanci, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 16/458,162

(22) Filed: Jun. 30, 2019

(65) Prior Publication Data
US 2020/0408081 A1    Dec. 31, 2020

(51) Int. Cl.
*E21B 47/017*    (2012.01)
*H05K 3/28*    (2006.01)

(52) U.S. Cl.
CPC ............ *E21B 47/017* (2020.05); *H05K 3/284* (2013.01)

(58) Field of Classification Search
CPC ........ E21B 47/017; E21B 47/01; E21B 47/13; H05K 3/284
See application file for complete search history.

(56) References Cited

U.S. PATENT DOCUMENTS

| | | | |
|---|---|---|---|
| 4,400,858 A * | 8/1983 | Goiffon | E21B 47/12 24/546 |
| 5,047,635 A | 9/1991 | Leaney et al. | |
| 5,931,000 A * | 8/1999 | Turner | E21B 36/003 62/3.2 |
| 6,012,537 A * | 1/2000 | Rountree | E21B 47/20 175/40 |
| 6,134,892 A * | 10/2000 | Turner | H01L 35/00 62/3.2 |
| 7,357,886 B2 | 4/2008 | Groth | |
| 7,806,173 B2 * | 10/2010 | Kaul | E21B 47/017 166/57 |
| 8,665,597 B2 * | 3/2014 | Lee | F21V 29/20 361/704 |

(Continued)

FOREIGN PATENT DOCUMENTS

CN    202385411 U    8/2012
JP    4393702 B2    1/2010

(Continued)

OTHER PUBLICATIONS

English abstrat of JP4393702; retrieved from www.espacenet.com on Jun. 30, 2019.

(Continued)

*Primary Examiner* — Nicole Coy
(74) *Attorney, Agent, or Firm* — Polsinelli PC (57) ABSTRACT

Aspects of the subject technology relate to a downhole protective housing for electronic components including a circuit board. The protective housing can include a chassis comprising two elongate side rails, a circuit board located between the pair of elongate side rails, an armature fixedly coupled to the chassis, a buffer coupled to the circuit board. The protective housing can further include a substantially cylindrical intermediate sleeve, a substantially cylindrical outer case, and a pair of end caps, one each located at opposite distal ends of the protective housing.

20 Claims, 6 Drawing Sheets

(56) References Cited

U.S. PATENT DOCUMENTS

| | | | |
|---|---|---|---|
| 8,922,988 B2 | 12/2014 | Swett et al. | |
| 9,879,520 B2* | 1/2018 | Fanini | E21B 47/017 |
| 10,012,036 B2 | 7/2018 | Goodman et al. | |
| 10,605,052 B2* | 3/2020 | Zhang | E21B 36/001 |
| 2005/0092527 A1 | 5/2005 | Le et al. | |
| 2006/0043635 A1 | 3/2006 | Groth | |
| 2006/0144619 A1* | 7/2006 | Storm, Jr. | H05K 7/20281 |
| | | | 175/17 |
| 2012/0323352 A1 | 12/2012 | Groth | |
| 2013/0235537 A1 | 9/2013 | Swett et al. | |
| 2014/0312752 A1* | 10/2014 | Durisotti | E21B 47/017 |
| | | | 312/237 |
| 2016/0265289 A1* | 9/2016 | Goodman | E21B 47/017 |
| 2018/0179882 A1* | 6/2018 | Treviranus | E21B 47/12 |

FOREIGN PATENT DOCUMENTS

| | | | |
|---|---|---|---|
| WO | 2015094213 A1 | 6/2015 | |
| WO | 2017147452 A1 | 8/2017 | |

OTHER PUBLICATIONS

International Search Report; PCT application No. PCT/US2019/040036, dated Mar. 31, 2020.

* cited by examiner

PROTECTIVE HOUSING FOR ELECTRONICS IN DOWNHOLE TOOLS

The present technology pertains to packaging electronics and, more specifically, to packaging electronics in downhole tool environments.

BACKGROUND

Electronic components may be disposed downhole for many purposes, such as to control downhole tools, communicate with the surface and analyze and store data. Such electronic components typically include printed circuit boards (PCBs) that are packaged to provide protection from downhole conditions, including temperature, pressure, vibration, shock, and other thermo-mechanical stresses, among other things. For example, wire line and measurement while drilling (MWD) logging tools for measuring certain formation characteristics and wellbore properties often use heat-sensitive electronic gauges and sensors. The drilling environment of a drilling bit boring into earth formations is extremely hostile. The rotational forces of the bit being rotated at the end of a long string of drilling pipe driven by rotation from the surface have created reliability problems for downhole electronics and sensors in the measuring tools. In particular, the extremely high vibration set up in the drilling bit and collars above the bit, as well as the sudden impact shocks caused by the drilling process, have frequently caused electronic instruments in proximity to the bit to fail. Downhole hydrostatic pressures can reach up to 30,000 psi or above. Therefore, sensitive electronics and sensors must be disposed in a pressure housing or vessel to shield the electronics from the downhole pressures, thereby avoiding damage. Protecting sensitive downhole electronics and sensors from extreme temperatures also relies on sheltering sensitive components from the cumulative effects of exposure to heat.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the principles disclosed herein. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The disclosed technology is a downhole protective housing for electronic components that utilizes a chassis comprising two elongate side rails fixedly coupled together at a distance from each other in a substantially parallel orientation. A circuit board is located between the pair of elongate side rails. Each of the side rails has a receiving space for the circuit board. The protective housing further utilizes an armature fixedly coupled to the chassis. The armature delineates a protective space in which the circuit board is housed. A buffer is configured to fit the armature and chassis within the downhole protective housing and secure the armature and chassis through the various surface and downhole environments. Various aspects of the subject technology are configured to provide a housing for electronic components on a downhole tool that protects the electronic components while optimizing the strength and rigidity of a downhole tool.

According to at least one aspect, the downhole protective housing utilizes a chassis comprising two elongate side rails fixedly coupled together by a spacing brace in a substantially parallel orientation. Two arcuate armatures, each fixedly coupled to the chassis are mirror oriented, one to the other, so that together the two arcuate armatures present a substantially cylindrical exterior surface. In this configuration, the two armatures delineate an interior protective space for electronic components installed within the protective housing. The protective housing further includes a sleeve circumferentially surrounding at least a portion of the exterior surface presented by the two arcuate armatures.

Figure 1A:
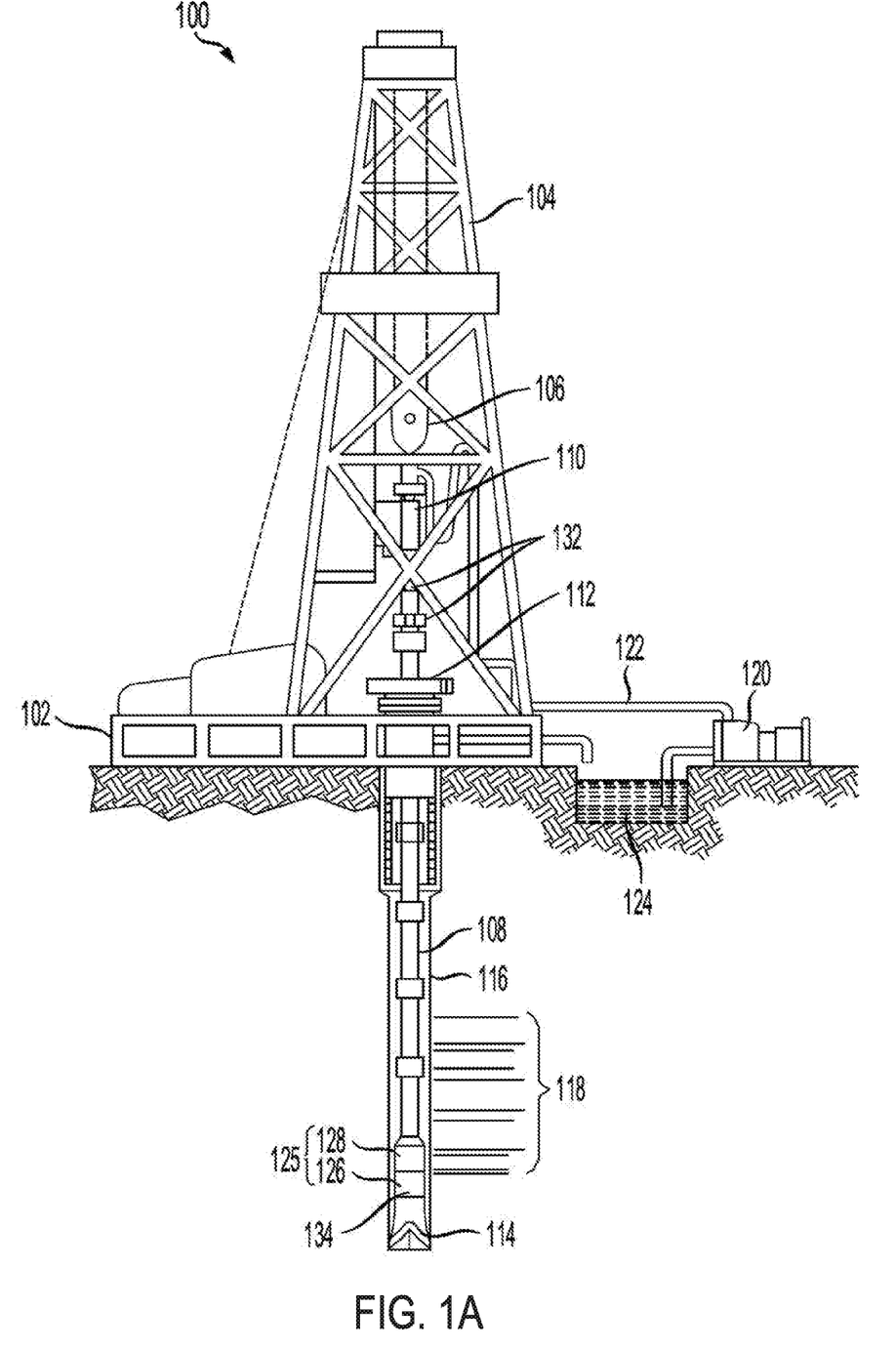
FIG. 1A is a schematic diagram of an example Logging While Drilling wellbore operating environment, in accordance with various aspects of the subject technology.

Turning now to FIG. 1A, a drilling arrangement is shown that exemplifies a Logging While Drilling (commonly abbreviated as LWD) configuration in a wellbore drilling scenario 100. Logging-While-Drilling typically incorporates sensors that acquire formation data. The drilling arrangement of FIG. 1A also exemplifies what is referred to as Measurement While Drilling (commonly abbreviated as MWD) which utilizes sensors to acquire data from which the wellbore's path and position in three-dimensional space can be determined. FIG. 1A shows a drilling platform 102 equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, it creates a wellbore 116 that passes through various subterranean formations 118. A pump 120 circulates drilling fluid through a supply pipe 122 to top drive 110, down through the interior of drill string 108 and out orifices in drill bit 114 into the wellbore. The drilling fluid returns to the surface via the annulus around drill string 108, and into a retention pit 124. The drilling fluid transports cuttings from the wellbore 116 into the retention pit 124 and the drilling fluid's presence in the annulus aids in maintaining the integrity of the wellbore 116. Various materials can be used for drilling fluid, including oil-based fluids and water-based fluids Logging tools 126 can be integrated into the bottom-hole assembly 125 near the drill bit 114. As the drill bit 114 extends the wellbore 116 through the formations 118, logging tools 126 collect measurements relating to various formation properties as well as the orientation of the tool and various other drilling conditions. The bottom-hole assembly 125 may also include a telemetry sub 128 to transfer measurement data to a surface receiver 132 and to receive commands from the surface. In at least some cases, the telemetry sub 128 communicates with a surface receiver 132 using mud pulse telemetry. In some instances, the telemetry sub 128 does not communicate with the surface, but rather stores logging data for later retrieval at the surface when the logging assembly is recovered.

Each of the logging tools 126 may include one or more tool components spaced apart from each other and communicatively coupled by one or more wires and/or other communication arrangements. The logging tools 126 may also include one or more computing devices communicatively coupled with one or more of the tool components. The one or more computing devices may be configured to control or monitor a performance of the tool, process logging data, and/or carry out one or more aspects of the methods and processes of the present disclosure.

In at least some instances, one or more of the logging tools 126 may communicate with a surface receiver 132 by a wire, such as wired drill pipe. In other cases, the one or more of the logging tools 126 may communicate with a surface receiver 132 by wireless signal transmission. In at least some cases, one or more of the logging tools 126 may receive electrical power from a wire that extends to the surface, including wires extending through a wired drill pipe.

Collar 134 is a frequent component of a drill string 108 and generally resembles a very thick-walled cylindrical pipe, typically with threaded ends and a hollow core for the conveyance of drilling fluid. Multiple collars 134 can be included in the drill string 108 and are constructed and intended to be heavy to apply weight on the drill bit 114 to assist the drilling process. It should be noted that the collars 134 can be heavy weighted collars for applying weight or any type of collar for housing bottom-hole sensors and can be located anywhere in the bottom-hole assembly 125. Because of the thickness of the collar's wall, pocket-type cutouts or other type recesses can be provided into the collar's wall without negatively impacting the integrity (strength, rigidity and the like) of the collar as a component of the drill string 108.

In at least some instances, one or more of the logging tools 126 may communicate with a surface receiver 132 by a wire, such as wired drillpipe. In other cases, the one or more of the logging tools 126 may communicate with a surface receiver 132 by wireless signal transmission. In at least some cases, one or more of the logging tools 126 may receive electrical power from a wire that extends to the surface, including wires extending through a wired drillpipe.

Figure 1B:
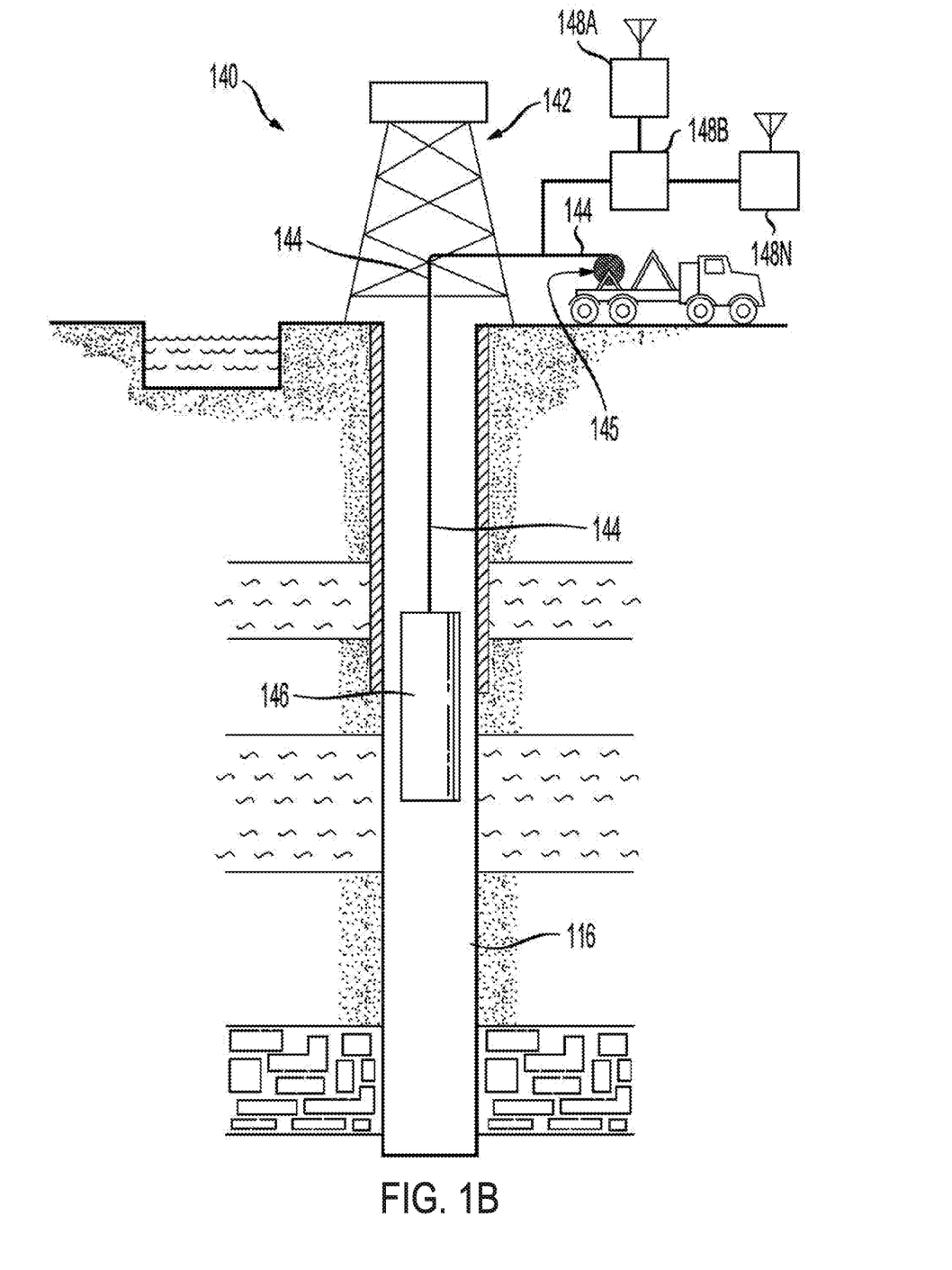
FIG. 1B is a schematic diagram of an example downhole environment, post-drilling, in accordance with various aspects of the subject technology.

Referring to FIG. 1B, an example system 140 is depicted for conducting downhole measurements after at least a portion of a wellbore has been drilled and the drill string removed from the well. A downhole tool is shown having a tool body 146 in order to carry out logging and/or other operations. For example, instead of using the drill string 108 of FIG. 1A to lower tool body 146, which can contain sensors and/or other instrumentation for detecting and logging nearby characteristics and conditions of the wellbore 116 and surrounding formations, a wireline conveyance 144 can be used. The tool body 146 can be lowered into the wellbore 116 by wireline conveyance 144. The wireline conveyance 144 can be anchored in the drill rig 142 or by a portable means such as a truck 145. The wireline conveyance 144 can include one or more wires, slicklines, cables, and/or the like, as well as tubular conveyances such as coiled tubing, joint tubing, or other tubulars.

The illustrated wireline conveyance 144 provides power and support for the tool, as well as enabling communication between data processors 148A-N on the surface. In some examples, the wireline conveyance 144 can include electrical and/or fiber optic cabling for carrying out communications. The wireline conveyance 144 is sufficiently strong and flexible to tether the tool body 146 through the wellbore 116, while also permitting communication through the wireline conveyance 144 to one or more of the processors 148A-N, which can include local and/or remote processors. Moreover, power can be supplied via the wireline conveyance 144 to meet power requirements of the tool. For slickline or coiled tubing configurations, power can be supplied downhole with a battery or via a downhole generator.

Figure 2A:
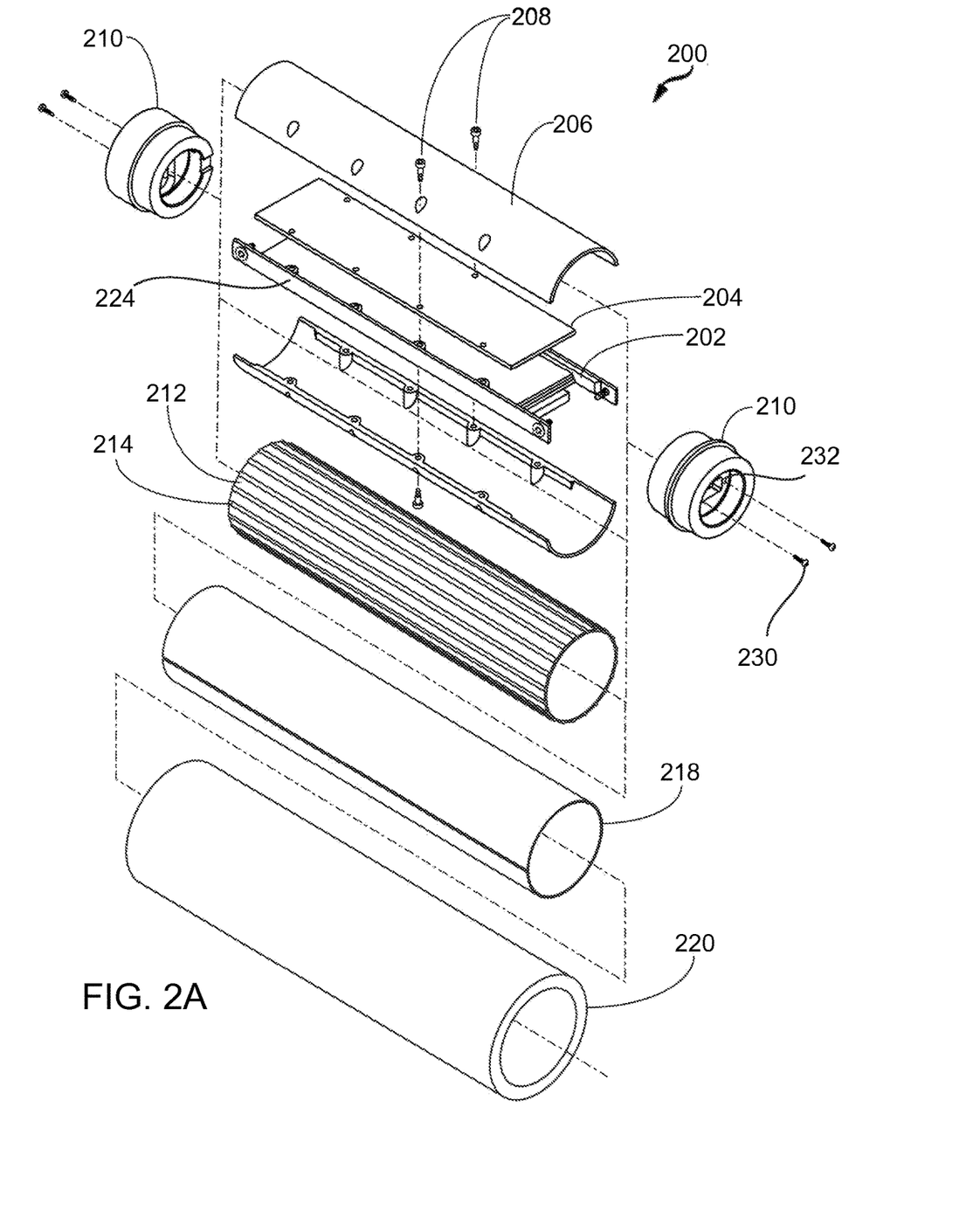
FIG. 2A is a schematic diagram illustrating an exploded view of the protective housing, in accordance with various aspects of the subject technology.

FIG. 2A illustrates an exploded view of the downhole protective housing 200, in accordance with various aspects of the subject technology. The protective housing 200 is disposed as part of a downhole tool. The downhole tool may be, for example, the bottom-hole assembly 125 of FIG. 1A, the tool body 146 of FIG. 1B, or any other object lowered into a wellbore. The downhole tool can be the logging tool 126 of FIG. 1A, or a portion thereof such as in a collar 134, which can take the form of a sensor collar, an electronics collar, or any other portion of a downhole tool. The term "logging tool" involves the understanding that this term encompasses the collection of formation parameters, drilling fluid properties, and both the collection of information regarding the movement and position of the drilling assembly.

A downhole tool often has an elongated body and includes an enclosure. The enclosure which can take the form of the protective housing 200 which houses electronic components and sensors of the downhole tool. Although the embodiments described herein are discussed in the context of including a circuit board, the embodiments may be used with any electronic component or other component that would benefit from a protective packaging or housing. Additionally, as is discussed in further detail throughout, various embodiments also have the added benefit of providing heat dissipation qualities that allow for heat to more efficiently dissipate from heat producing components (e.g., electronic components, circuit boards, etc.) to the surrounding armatures, collar, and/or tool body. Furthermore, the components of the protective housing 200 are configured to provide a strength and rigidity to the protective housing such that, when the driving frequency of the downhole tool is less than the natural frequency, the vibration transmissibility of the protective housing is at or near 1.

As is illustrated in FIG. 2A, a chassis 202 can be provided in a frame format with elongate members and/or additionally having planar components that present exposed top and bottom exterior surfaces to which electronic components and sensors can be mounted. The chassis 202 can include one or more side rails 224 that present top and bottom surfaces of the chassis 202 and to which electronic components can be mounted. More specifically, the side rails 224 of the chassis 202 can be utilized for mounting one or more circuit boards 204 thereto. As shown, the side rails 224 are oriented substantially parallel to one another, at a uniform, spaced apart distance. To establish this orientation, the side rails 224 can be fixedly coupled together by a spacing brace 226. If in a planar format, the sheet-like brace 226 delineates two (divides into two) electronic component receiving spaces within the protective housing 200. As depicted, the side rails 224 provide uniform support along the entire length of the circuit board 204.

In another aspect, the side rails 224 of the chassis 202 accommodate heat transfer from the circuit board 204 to the surrounding armatures 206 and end caps 210. The side rails 224 of the chassis 202 allow for increased surface contact area between the circuit board 204, chassis 202, and armatures 206, which in turn improves thermal heat transfer to the armatures 206 and end caps 210. The surface area contact between the chassis 202 and the circuit board 204 allows heat to be transferred from the circuit boards 204 to the chassis 202 and to the armatures 206. In some examples, multiple circuit boards 204 may be stacked on either side of the brace 226. According to some embodiments, the chassis 202 can be at least partially constructed from aluminum. However, in other embodiments, the chassis 202 can include other materials, metals, polymers, metals, alloys, compounds, composites, or other rigid materials.

Two arcuate armatures 206 can act to strengthen and rigidify the chassis 202 and protect the electronic components. Examples of such electronic components include sensors, transmitters, receivers, batteries, power supplies, computing devices or components and anything that incorporates electronic components such as transistors, integrated circuits, resistors, capacitors, and inductors, as well as electronic components such as sensing elements, not limited to but including accelerometers, magnetometers, scintillation crystals, photomultiplier tubes, and strain gauges. The armatures 206 surround one or more portions of the electronic components and provide a layer of protection for the electronic components. The rigid nature of the armatures 206 further provide an additional element of rigidity that allows the protective housing 200, and all the components contained therein, to reach a vibration transmissibility of or near 1 (e.g., the ratio of the vibration input to the protective housing 200 to the vibration output of the components inside the protective housing is at or near 1). The armatures 206 are each fixedly coupled to the chassis 202 and are mirror-oriented to each other. The armatures 206 are substantially arcuate shaped in cross-section. Together, the arcuate armatures 206 present a substantially cylindrical exterior surface and delineate an interior protective space for electronic components within the protective housing 200. The armatures 206 may further facilitate heat dissipation from the electronic components, including the circuit boards 204, to the surrounding armatures 206 and in turn, a tool body 146 or collar 134 that includes the protective housing 200.

In order to secure the armatures 206 to the circuit boards 204 and chassis 202, retention screws 208 may be utilized. A retention screw 208 may be disposed through the one or more circuit boards 204 and threadably engaged with an appropriate threaded aperture disposed on the chassis 202. The screws 208 can be used to establish a ground between the circuit board 204 and the armatures 206. It should be understood that any suitable fastener may be used to secure the armatures 206 to the circuit board 204 and chassis 202, including clamps, rivets, and/or clips. The housing is further held together by one or more end caps 210. The end caps 210 are located at opposite distal ends of the protective housing 200 and engage at least end portions of the armatures 206, establishing a substantially rigid frame of the protective housing 200. The endcaps may include a cavity configured to receive a connector to the circuit boards 204 and/or the electronic components. The connector may be secured into place using, for example, screws 230 through screw holes 232. However, other types of fasteners may also be used. The end caps 210 are releasably coupled to each of the armatures 206 thereby facilitating assembly and disassembly of the protective housing 200. The end caps 210 may be secured in place using any suitable fastener (e.g., screws, clamps, rivets, clips, or the like) or mechanism (e.g., pressure, friction, etc.).

A buffer 212 is disposable over the armatures 206 and can be made of polymer or other elastomeric material. The buffer 212 may take the form of a compliant sleeve 212 that circumferentially surrounds at least a portion of the substantially cylindrical exterior surface presented by the combination of the two arcuate armatures 206. The compliant sleeve 212 can secure the protective housing 200 within an outer case 220 and provide an improved fit between the exterior surface presented by the combination of the two arcuate armatures 206 and the outer case 220.

The compliant sleeve 212 is shown in FIG. 2A with raised ribs 214 along its exterior surface that enable the improved fit and, in some cases, allow for improved expansion of the compliant sleeve 212 in hot downhole environments. The compliant sleeve 212 may be made of a polymer having elastic properties (e.g., an elastomer) or any other rubber, plastic or otherwise suitable material. The raised ribs 214 may be made of the same material (e.g., an elastomeric material) as the compliant sleeve 212 or of a different material depending on desired characteristics. The raised ribs 214 are radially compressible to allow for an improved fit between the armatures, an optional intermediate sleeve 218, and the outer case 220.

The raised ribs 214 provide friction that resists movement of the compliant sleeve 212, but also gives space for the compliant sleeve 212 to thermally expand and contract. Although long raised ribs 214 positioned along the length of the compliant sleeve 212 are shown in FIG. 2A, the ribs may be in different sizes, positions, and/or orientations as well. Furthermore, although FIG. 2A shows raised ribs, other types of raised surface may be used instead of or in combination with raised ribs. Other types of raised surfaces may include bumps, nodes, nubs, or other shapes and different types of raised surfaces may be used in combination with one another to form a pattern.

An optional intermediate sleeve 218 can be disposed between the compliant sleeve 212 and the outer case 220 to reduce friction between the compliant sleeve 212 and the outer case 220 in order to facilitate installation of the assembly in the outer case 220. The intermediate sleeve 218 can include a slit 222 to allow the intermediate sleeve 218 to have a more exact fit about the compliant sleeve 212. The intermediate sleeve 218 may be constructed from a fiber reinforced composite, such as a carbon fiber composite, aramid fiber composite, or fiber glass composite, and/or other material.

Various aspects of the subject technology provide several technological improvements over other approaches and solve various technical issues seen in other approaches. For example, the housing 200 protects the circuit board 204 or other component and provides a chassis 202 on which the circuit board 204 can be mounted. At the same time, the protective housing 200 maintains a desirable level of strength and rigidity that improves the performance and operating characteristics of the downhole tool. In some embodiments, the rigidity of the frame enables the protective housing 200 and the components within the protective housing to achieve a relative vibration transmissibility of 1 or near 1. Previous approaches typically mount circuit boards 204 and similarly sensitive electronic components in cushioned shock supports which degrade vibration performance, or mount in completely rigid supports that degrade shock performance. This embodiment maximizes vibration transmissibility performance and still provides shock isolation.

Other approaches may include the circuit boards 204 or other sensitive electronic components into a cavity of a downhole tool. However, such approaches also provide suboptimal strength and rigidity characteristics. Furthermore, rather than potting the components (e.g., electronics) in a solid-molded approach, the presently disclosed protective housing 200 is utilized. The solid-molded approach is subject to potential manufacturing and field maintenance problems. For example, after a significant investment in building and testing the electronic modules, they can become damaged beyond repair during the subsequent foaming/potting process. When the potting material is injected into a mold or cavity with the electronic components, for instance, it can move or damage components, wires, or connections. This also limits the variety of potting materials that may be used because, for example, high-pressure injection molding materials or processes can damage electronic components. Furthermore, when the potting material cures it can move wires and/or place stress on various electronic components of the circuit board, thereby increasing the failure rate of the circuit board. Additionally, in the high temperatures of the downhole environment, the potting materials may expand and damage the electronic components. The solid-molding approach further involves expensive and time consuming injection molding and curing processes. Furthermore, once the potting material is cured around the electronic components, parts of the solid-molded module may not be reused or repaired. By separating the compliant member from the PCB, the compliant sleeve can utilize materials that are optimized for performance. Materials molded directly around PCBs are limited in performance and manufacturing processes.

Aspects of the subject technology avoid these drawbacks and provide additional technical advantages. For example, in addition to protecting sensitive electronic components and providing a desirable level of strength and rigidity, a feature of some aspects of the subject technology disclosed herein allow for the reuse of all or portions of the protective housing 200. For example, if a circuit board 204 is damaged, the circuit board 204 may be replaced or repaired while other portions of the protective housing 200 (e.g., the armatures 206, the chassis 202, end caps 210, and sleeve 218) may be reused. Furthermore, as is discussed further below, aspects of the subject technology provide for improved heat dissipation characteristics.

Figure 2B:
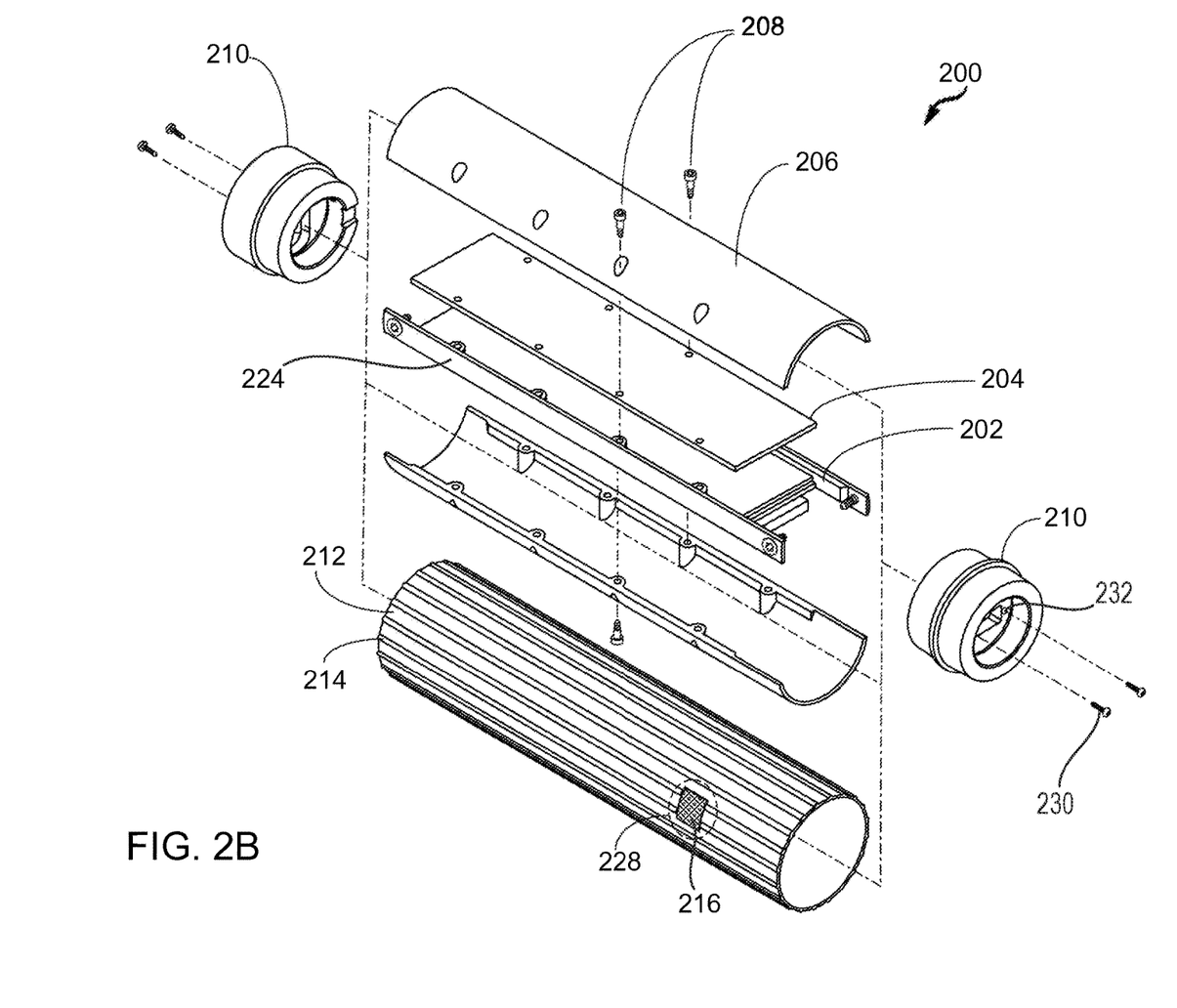
FIG. 2B is a schematic diagram illustrating an exploded view of the protective housing, in accordance with various aspects of the subject technology.

FIG. 2B further illustrates an exploded view of the protective housing 200, in accordance with various aspects of the subject technology. The electronic components housed in the armature 206 may generate heat which can adversely affect performance, especially in high temperature downhole environments. In this embodiment, the compliant sleeve 212 may have a small space cut out of it to form a penetrable window 228, but not so much as to reduce the strength and rigidity of the protective housing 200 beyond an acceptable amount. A heat conductive member 216 is arranged to aid in conducting heat away from an interior space of the protective housing 200 and may be inserted in the penetrable window 228 of the compliant sleeve 212.

As noted above, the circuit board 204 may be mounted to the side rails 224 of the chassis 202. The side rails 224, the chassis 202, and the surrounding armatures 206 are configured to accommodate heat transfer from the circuit board 204 to the surrounding areas. The heat conductive member 216 abuttingly engages the the armature 206 and/or chassis 202 to dissipate heat from the armature 206 and/or chassis 202, The heat can then be transferred via the heat conductive member 216 to the assembly that the housing is mounted in, such as an outer case 220 or the collar 134, itself. The heat conductive member 216 may be a thin layer of the copper mesh type material. The penetrable windows 228 having the heat conductive member 216 may be of any shape, such as circular, rectangular, or any other shape. The penetrable windows 228 having the heat conductive member 216 may be variously sized in dependence upon the specifics of the inclusive tool. An alternative and/or addition to the conductive member 216 and window 228 is to utilize thermally conductive materials for the compliant sleeve 212 and intermediate sleeve 218.

Figure 3A:
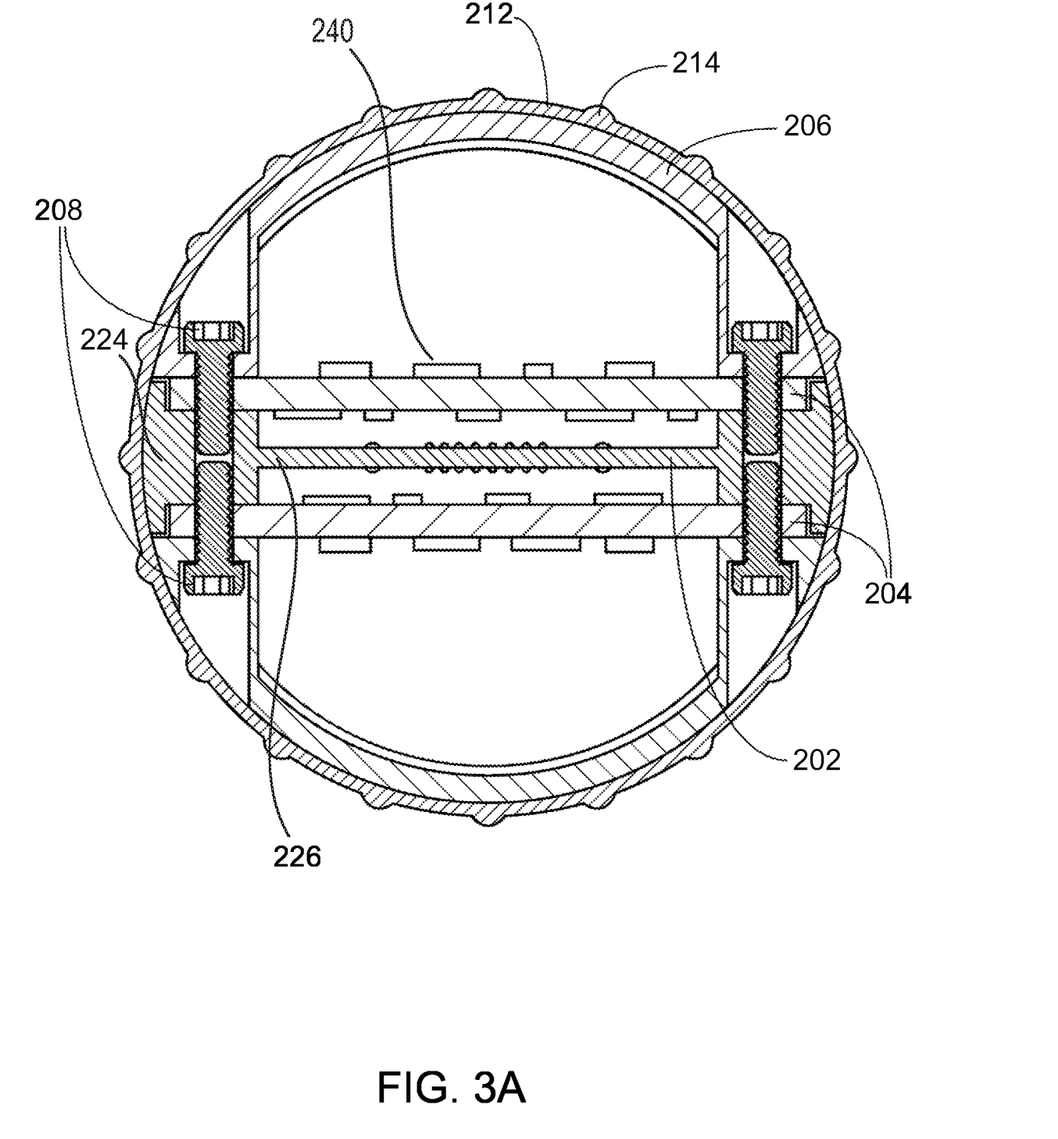
FIG. 3A is a cross-sectional view of the protective housing, in accordance with various aspects of the subject technology.
Figure 3B:
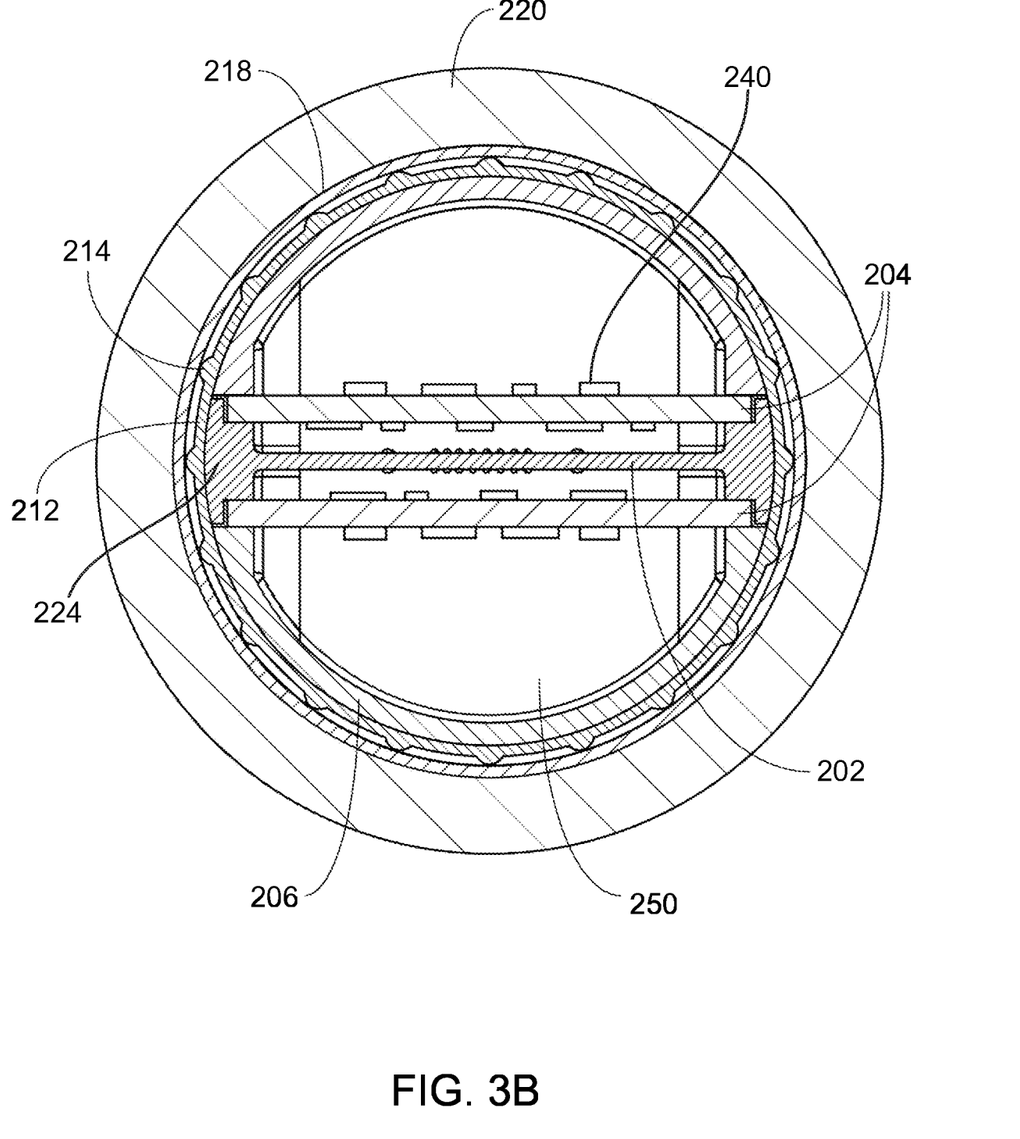
FIG. 3B is a cross-sectional view of the protective housing, in accordance with various aspects of the subject technology.

FIGS. 3A and 3B provide cross-sectional views of the enclosure which can be the protective housing 200. The chassis 202 is shown with circuit boards 204 mounted on either side of the chassis 202. One or more electrical components 240 may be embedded on the circuit boards 204. A rigid armature 206 is secured to the chassis and circuit boards 204 by way of retention screws 208. The armature 206 presents a substantially cylindrical exterior surface and delineates an interior protective space 250 for electronic components.

According to some embodiments, the retention screws may be configured to vertically compress a circuit board 204 between the chassis 202 and a rigid armature 206. Furthermore, in some embodiments, there may be a slight gap between the armatures 206 and side rails 224 of the chassis 202 to ensure the circuit board 204 is vertically compressed. In other embodiments, however, each of the side rails 224 may have a receiving space in which a lateral side portion of the circuit board 204 may abuttingly engage the respective side rail.

The housing 200 is of tubular shape and the same geometry of the housing may be used for round areas or pockets. Once the entire housing is mechanically secured, with the compliant sleeve 212 being the outer layer, the assembly may be slid into the receiving pressure sonde or collar 134. In one example, lubricant may be utilized to aid installation into the pressure case 220 or a cavity in the collar 134. In another example, friction can be allowed to naturally "lock" the assembly together by resisting movement between engaged components.

As illustrated in FIG. 3B, in some aspects of the subject technology, an intermediate sleeve 218, which may be a composite or low friction material sleeve, is provided as a removable protective cover. The intermediate sleeve 218 may be used to slide over the compliant sleeve 212. The intermediate sleeve 218 may be disposed beneath the outer tubing 220. The intermediate sleeve 218 reduces the friction between the compliant sleeve 212 and the outer case or pressure case 220. The intermediate sleeve 218 may aid in the installation of the compliant sleeve 212. The intermediate sleeve 218 may be a single component or be comprised of multiple pieces. The intermediate sleeve 218 may be constructed from a fiber reinforced composite, such as a carbon fiber composite, aramid fiber composite, or fiber glass composite, and/or other material.

The intermediate sleeve 218 may also have penetrable windows aligned with the penetrable windows 228 of the compliant sleeve 212 to facilitate heat transfer using the heat conductive member 216 which is of copper mesh or any other conductive material. The aligned penetrable windows will allow the heat that is transferred from the electronic components and the armature to the heat conductive member 216 inserted in the compliant sleeve 212 to be further transferred to the outer case 220 or collar 134.

Although various aspects of the subject technology provide for a rigid protective housing 200 and components therein (e.g., the compliant sleeve 212) that allow for a vibration transmissibility at or near 1 when the driving frequency of the downhole tool is less than the natural frequency, in some situations the compliant sleeve 212 may be able to provide a degree of shock isolation. Furthermore, in situations where the natural frequency is lower than the driving frequency, the compliant sleeve 212 may be able to provide some degree of vibration absorption or isolation.

In the foregoing description, aspects of the application are described with reference to specific embodiments thereof, but those skilled in the art will recognize that the application is not limited thereto. Thus, while illustrative embodiments of the application have been described in detail herein, it is to be understood that the disclosed concepts may be otherwise variously embodied and employed, and that the appended claims are intended to be construed to include such variations, except as limited by the prior art. Various features and aspects of the above-described subject matter may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

In the above description, terms such as "upper," "upward," "lower," "downward," "above," "below," "downhole," "uphole," "longitudinal," "lateral," and the like, as used herein, shall mean in relation to the bottom or furthest extent of the surrounding wellbore even though the wellbore or portions of it may be deviated or horizontal. Correspondingly, the transverse, axial, lateral, longitudinal, radial, etc., orientations shall mean orientations relative to the orientation of the wellbore or tool. Additionally, the illustrative embodiments are illustrated such that the orientation is such that the right-hand side is downhole compared to the left-hand side.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicate that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder.

The term "radially" means substantially in a direction along a radius of the object, or having a directional component in a direction along a radius of the object, even if the object is not exactly circular or cylindrical. The term "axially" means substantially along a direction of the axis of the object. If not specified, the term axially is such that it refers to the longer axis of the object.

The term "proximate," "proximal" and other variants thereof are utilized to mean located close to, closer to and/or nearby, depending upon context. The term "distal" and variants thereof are utilized to mean located at a distance from or farther away from, depending upon context. Proximate and distal can be used as comparatives to one another with that which is characterized as "proximate" being comparatively closer than that which is characterized as "distal." As an example, the proximate end of the drill string to the bottom of the wellbore is the lower end of the drill string and the distal end of the drill string to the bottom of the wellbore is the upper end of the drill string.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. The described features and steps are disclosed as possible components of systems and methods within the scope of the appended claims.

Claim language reciting "at least one of" a set indicates that one member of the set or multiple members of the set satisfy the claim. For example, claim language reciting "at least one of A and B" means A, B, or A and B.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

Statements of the disclosure include:

Statement 1: A downhole protective housing for electronic components including a circuit board, the protective housing comprising a chassis comprising two elongated side rails fixedly coupled together at a distance from each other in a substantially parallel orientation; a circuit board positioned between the chassis and an armature; and the armature fixedly coupled to the chassis, the armature delineates a protective space in which the circuit board is housed.

Statement 2: A downhole protective housing according to Statement 1, wherein at least part of the circuit board abuttingly engages at least a portion of the chassis and armature, thereby facilitating heat dissipation from the circuit board to the chassis and armature.

Statement 3: A downhole protective housing according to any of Statements 1 and 2, further comprising at least two arcuate armatures, each fixedly coupled to at least one of the circuit board or the chassis and together having a substantially cylindrical exterior surface.

Statement 4: A downhole protective housing according to any of Statements 1 through 3, further comprising a buffer coupled to the armature, wherein the buffer is constructed, at least partially, from an elastomeric material.

Statement 5: A downhole protective housing according to any of Statements 1 through 4, wherein the elastomeric material is at least one of plastic and rubber.

Statement 6: A downhole protective housing according to any of Statements 1 through 5, wherein the buffer is a compliant sleeve that circumferentially surrounds at least a portion of a substantially cylindrical exterior surface presented by the two arcuate armatures.

Statement 7: A downhole protective housing according to any of Statements 1 through 6, further comprising a plurality of raised surfaces located at an exterior surface of the compliant sleeve.

Statement 8: A downhole protective housing according to any of Statements 1 through 7, further comprising a substantially cylindrical intermediate sleeve having an interior surface abuttingly engaging a distal portion of each of the plurality of raised surfaces, wherein each of the raised surfaces is radially compressible.

Statement 9: A downhole protective housing according to any of Statements 1 through 8, wherein the intermediate sleeve has a lengthwise slit therethrough facilitating adjustment of a diameter of the substantially cylindrical intermediate sleeve.

Statement 10: A downhole protective housing according to any of Statements 1 through 9, further comprising a substantially cylindrical outer case surrounding the compliant and intermediate sleeves and establishing a fluid barrier between an interior of the protective housing and an ambient downhole environment.

Statement 11: A downhole protective housing according to any of Statements 1 through 10, further comprising a pair of end caps, one each located at opposite distal ends of the protective housing and abuttingly engaging at least end portions of the armatures and thereby establishing a substantially rigid frame within the protective housing.

Statement 12: A downhole protective housing according to any of Statements 1 through 11, wherein each of the pair of end caps is releasably coupled to each of the armatures thereby facilitating assembly and disassembly of the protective housing.

Statement 13: A downhole protective housing according to any of Statements 1 through 12, wherein at least one of the compliant sleeve or the intermediate sleeve comprises a thermally conductive material.

Statement 14 A downhole protective housing according to any of Statements 1 through 13, further comprising at least one retention screw configured to fasten the armature, the circuit board, and the chassis.

Statement 15: A downhole protective housing according to any of Statements 1 through 14, further comprising a substantially planar spacing brace fixedly coupled between the side rails thereby delineating two electronic component receiving spaces within the protective housing.

Statement 16: A downhole protective housing according to any of Statements 1 through 15, further comprising a heat conductive member arranged to conduct heat from an interior space of the protective housing.

Statement 17: A downhole protective housing according to any of Statements 1 through 16, wherein the heat conductive member abuttingly engages the armature for dissipating heat from the circuit board.

Statement 18: A downhole protective housing for electronic components, the protective housing comprising a chassis comprising two elongate side rails fixedly coupled together by a spacing brace in a substantially parallel orientation; two arcuate armatures, each fixedly coupled to the chassis and mirror oriented, one to the other, so that together the two arcuate armatures present a substantially cylindrical exterior surface and the two armatures delineate an interior protective space for electronic components within the protective housing; and a sleeve circumferentially surrounding at least a portion of the substantially cylindrical exterior surface presented by the two arcuate armatures.

Statement 19: A downhole protective housing according to Statement 18, further comprising an electronic component coupled to the chassis.

Statement 20: A downhole protective housing according to any of Statements 18 through 19, further comprising a circuit board located between the two elongate side rails.

What is claimed is:

1. A downhole protective housing for electronic components including a circuit board, the protective housing comprising:
   a chassis comprising two elongated side rails fixedly coupled together at a distance from each other in a substantially parallel orientation;
   a circuit board positioned between the chassis and two armatures;
   the two armatures fixedly coupled to the chassis in a mirrored orientation with respect to each other, the armatures delineating a protective space in which the circuit board is house;
   a compliant sleeve that circumferentially surrounds at least a portion of an exterior surface formed by the two armatures, the compliant sleeve including a plurality of raised surfaces along an exterior surface of the compliant sleeve; and an intermediate sleeve that circumferentially surrounds at least a portion of the compliant sleeve.

2. The downhole protective housing of claim 1, wherein at least part of the circuit board abuttingly engages at least a portion of the chassis and the two armatures, thereby facilitating heat dissipation from the circuit board to the chassis and armature.

3. The downhole protective housing of claim 1, wherein the two armatures are each fixedly coupled to at least one of the circuit board or the chassis and together have a substantially cylindrical exterior surface.

4. The downhole protective housing of claim 1, wherein the buffer wherein the compliant sleeve is constructed, at least partially, from an elastomeric material.

5. The downhole protective housing of claim 4, wherein the elastomeric material is at least one of plastic and rubber.

6. The downhole protective housing of claim 4, wherein the two armatures are two arcuate armatures fixedly coupled to the chassis, wherein the compliant sleeve circumferentially surrounds at least a portion of a substantially cylindrical exterior surface presented by the two arcuate armatures.

7. The downhole protective housing of claim 1, wherein the intermediate sleeve is a substantially cylindrical intermediate sleeve having an interior surface abuttingly engaging a distal portion of each of the plurality of the raised surfaces, wherein each of the raised surfaces is radially compressible.

8. The downhole protective housing of claim 7, wherein the intermediate sleeve has a lengthwise slit therethrough facilitating adjustment of a diameter of the substantially cylindrical intermediate sleeve.

9. The downhole protective housing of claim 8, further comprising a substantially cylindrical outer case surrounding the compliant and intermediate sleeves and establishing a fluid barrier between an interior of the protective housing and an ambient downhole environment.

10. The downhole protective housing of claim 9, further comprising a pair of end caps, one each located at opposite distal ends of the protective housing and abuttingly engaging at least end portions of the armatures and thereby establishing a substantially rigid frame within the protective housing.

11. The downhole protective housing of claim 10, wherein each of the pair of end caps is releasably coupled to each of the armatures thereby facilitating assembly and disassembly of the protective housing.

12. The downhole protective housing of claim 7, wherein at least one of the compliant sleeve or the intermediate sleeve comprises a thermally conductive material.

13. The downhole protective housing of claim 1, further comprising at least one retention screw configured to fasten the two armatures, the circuit board, and the chassis.

14. The downhole protective housing of claim 1, further comprising a substantially planar spacing brace fixedly coupled between the side rails thereby delineating two electronic component receiving spaces within the protective housing.

15. The downhole protective housing of claim 1, further comprising a heat conductive member arranged to conduct heat from an interior space of the protective housing.

16. The downhole protective housing of claim 15, wherein the heat conductive member abuttingly engages at least one of the two armatures for dissipating heat from the circuit board.

17. A method for disposing a circuit board in a downhole protective housing comprising:
positioning a circuit board relative to a chassis comprising two elongated side rails fixedly coupled together at a distance from each other in a substantially parallel orientation;
fixedly coupling two armatures to the chassis in a mirrored orientation with respect to each other, the armatures delineating a protective space that houses the circuit board positioned relative to the chassis;
disposing a compliant sleeve to circumferentially surround at least a portion of an exterior surface formed by the two armatures, the compliant sleeve including a plurality of raised surfaces along an exterior surface of the compliant sleeve; and
disposing an intermediate sleeve that circumferentially surrounds at least a portion of the compliant sleeve.

18. The method of claim 17, wherein at least part of the circuit board abuttingly engages at least a portion of the chassis and the two armatures, thereby facilitating heat dissipation from the circuit board to the chassis and armature.

19. The method of claim 17, wherein the two armatures are each fixedly coupled to at least one of the circuit board or the chassis and together have a substantially cylindrical exterior surface.

20. The method of claim 17, wherein the compliant sleeve is constructed, at least partially, from an elastomeric material.

* * * * *